United States Patent
Hsieh et al.

(10) Patent No.: US 7,823,104 B2
(45) Date of Patent: Oct. 26, 2010

(54) DETERMINATION OF SINGLE-FIX RECTIFICATION FUNCTION

(75) Inventors: Cheng-Ta Hsieh, San Jose, CA (US);
Yifeng Wang, Fremont, CA (US);
Yung-Te Lai, Cupertino, CA (US);
Chih-Chang Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 459 days.

(21) Appl. No.: 11/841,079

(22) Filed: Aug. 20, 2007

(65) Prior Publication Data

US 2008/0288900 A1 Nov. 20, 2008

Related U.S. Application Data

(60) Provisional application No. 60/938,129, filed on May 15, 2007.

(51) Int. Cl.
*G06F 17/50* (2006.01)
(52) U.S. Cl. .......................................................... 716/5
(58) Field of Classification Search ................. 716/1–18
See application file for complete search history.

(56) References Cited

OTHER PUBLICATIONS

Huang et al., "AutoFix: A Hybrid Tool for Automatic Logic Rectification", IEEE Transactions on Computer-Aided Design of Integrated Circuits and Systems, vol. 18, issue 9, pp. 1376-1384, Sep. 1999.*
Hoffmann et al., "Efficient Design Error Correction of Digital Circuits", Proceedings of the 2000 International Conference on Computer Design, pp. 465-472, 2000.*
Steve Golson, "The Human ECO Compiler", SNUG San Jose 2004, Trilobyte Systems, Carlisle, MA. Revised: Mar. 21, 2004. 57pgs.
Heh-Tyan Liaw et al., "Efficient Automatic Diagnosis of Digital Circuits", Department of Electrical Engineering, Taipei, Taiwan, CH2924-9 Copyright 1990 IEEE. pp. 464-467.
Shi-Yu Huang et al., "ErrorTracer: Design Error Diagnosis Based on Fault Simulation Techniques", IEEE Transactions on Computer-Aided Design of Integrated Circuits and Systems, vol. 18, No. 9, Sep. 1999. 0278-0070. pp. 1341-1352.

* cited by examiner

*Primary Examiner*—Vuthe Siek
*Assistant Examiner*—Aric Lin
(74) *Attorney, Agent, or Firm*—Brian J Colandreo, Esq.; V. Raman Bharatula; Holland & Knight LLP

(57) ABSTRACT

Some aspects provide determination of a function to rectify functional differences between netlist $G_1$ and netlist $G_2$ having inputs V. The determination may include determination of a signal s of netlist $G_1$ that can be re-synthesized so as to correct the functional differences between netlist $G_1$ and netlist $G_2$, assignment of respective static values to a first plurality of inputs V, assignment of respective initial values to a second plurality of inputs V, determination of a first function based on the assigned static values, the assigned initial values, a first error function reflecting the difference between outputs of netlist $G_1$ and netlist $G_2$ for each vector of inputs V in a case that s equals 0, and a second error function reflecting the difference between the outputs of netlist $G_1$ and netlist $G_2$ for each vector of inputs V in a case that s equals 1. Also included may be determination of whether the first function rectifies the functional differences between netlist $G_1$ and netlist $G_2$, assignment, if it is determined that the first function does not rectify the functional differences, of respective next values to the second plurality of inputs, and determination of a second function based on the first function, the assigned static values, the assigned next values, the first error function, and the second error function.

27 Claims, 10 Drawing Sheets

$G_1$ (w/ $S_1$ Fix)

$G_1$ (w/ $S_2$ Fix)

| a | x | y | G₁ | G₂ | E₀ | E₁ |
|---|---|---|----|----|----|----|
| 1 | 0 | 0 | 0  | 0  | 0  | 0  |
| 1 | 0 | 1 | 0  | 0  | 0  | 0  |
| 1 | 1 | 0 | s  | 0  | 0  | 1  |
| 1 | 1 | 1 | s  | 1  | 1  | 0  |
| 0 | 0 | 0 | s  | 1  | 1  | 0  |
| 0 | 0 | 1 | s  | 0  | 0  | 1  |
| 0 | 1 | 0 | s  | 0  | 0  | 1  |
| 0 | 1 | 1 | 0  | 0  | 0  | 0  |

$E_1|_{a=1} = xy$
$E_0|_{a=1} = xy'$ $E_1|_{a=0} = x'y'$
$E_0|_{a=0} = x'y'+xy'$ $Fs\_on = E_0|_{a=1} + E_0|_{a=0} = (x \wedge y)'$ $Fs\_off = E_1'|_{a=1} \cdot E_1'|_{a=0} = (x \wedge y)'$

```
partition V into {Vt, Vu1, Vu2, Vu3}, where Vu1 is C1, Vu3 are abort list
while (true) { // LOOP1
    repartition = 0;
    Derive init. assignment C2 for vu2 and vu3 based on solving Care(V)=1
    Fs_on = E0|Vu=C1,{Vu2,Vu3}=C2
    Fs_off = E1'|Vu1=C1,{Vu2,Vu3}=C2
    while (true) { // LOOP2
        If (G1(Vu1=C1,s=Fs_on)==G2) is TRUE) break; else Vdiff1 = (t1, u1);
        If (G1(Vu1=C1,s=Fs_off)==G2) is TRUE) break; else Vdiff2 = (t2, u2);

if (Fs_on(t1)) repartition = 1; Vdiff = Vdiff1; break;
        if (Fs_off'(t2)) repartition = 2; Vdiff = Vdiff2; break;

Fs_on = Fs_on + E0(Vu=C1,{Vu2,Vu3}=u1);
        Fs_off = Fs_off · E1'(Vu=C1,{Vu2,Vu3}=u2);
    }
    If (repartition) { // move variable from Vu3 to Vt
        if (Vu3 is empty) assert(ERROR);
        found = FALSE;
        for each variable i in Vu3 {
            Vdiff_new = Vdiff (flip bit on variable i);
            if (repartition == 1) {
                if (G1(s=Fs_on)^G2)(Vdiff_new) == FALSE) {
                    move variable i to Vt;
                    found = TRUE;
                }
            } else { // 2
                if (G1(s=Fs_off)^G2)(Vdiff_new) == FALSE) {
                    move variable i to Vt;
                    found = TRUE;
                }
            }
        }
        if (! found) move the first variable of Vu3 to Vt // randomly pick one
    } else break; // done
}
```

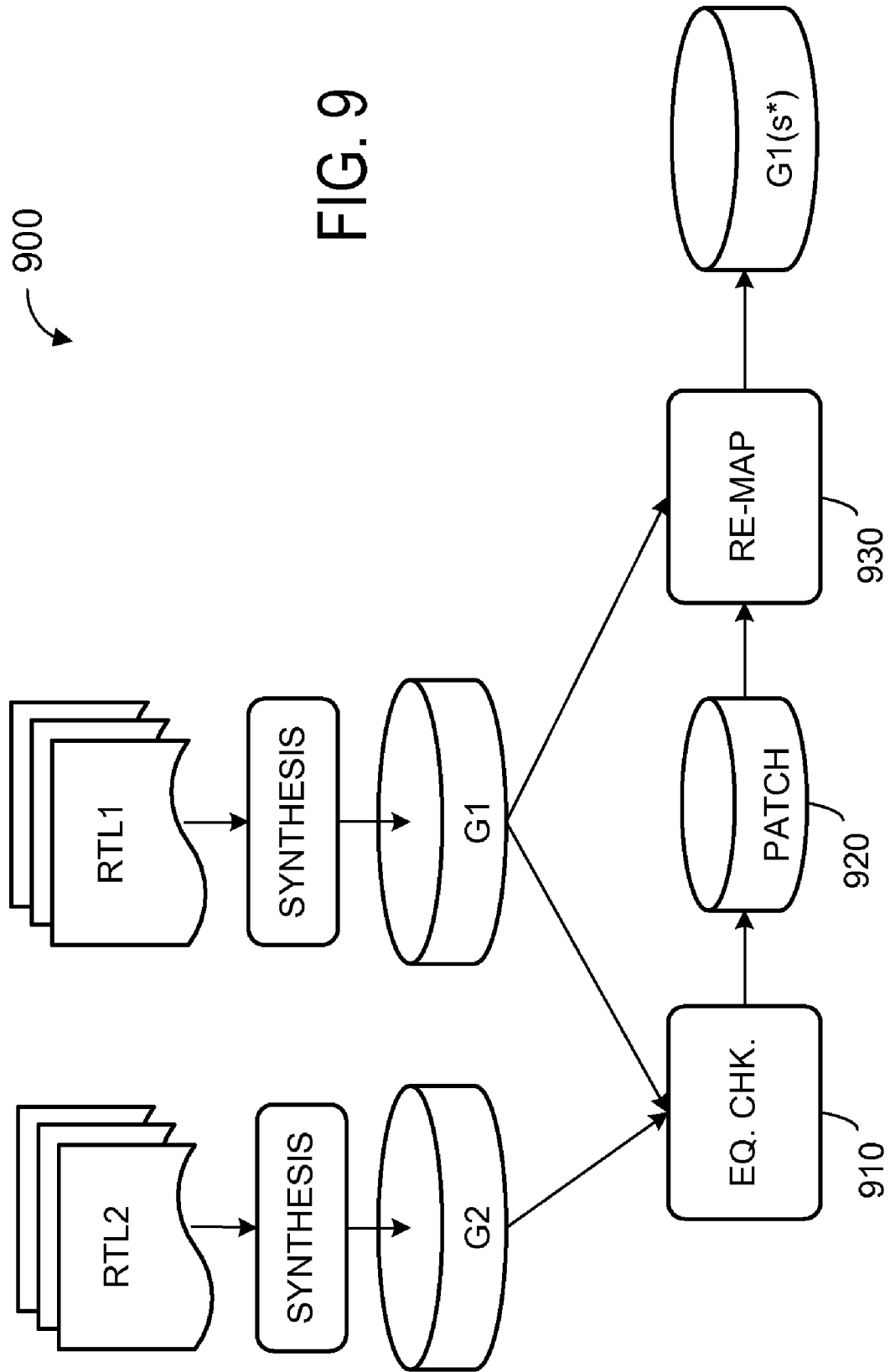

DETERMINATION OF SINGLE-FIX RECTIFICATION FUNCTION

CROSS-REFERENCE TO RELATED APPLICATIONS

The present application claims priority to U.S. Provisional Patent Application Ser. No. 60/938,129, filed on May 15, 2007 and entitled "Determination of Single-Fix Rectification Function", the contents of which are incorporated herein by reference for all purposes.

BACKGROUND

Conventional integrated circuit design involves several complex steps. For example, a circuit designer may use software tools to define the operation of each functional element of an integrated circuit at each clock cycle. Such a definition is known as a Register Transfer Level (RTL) specification. A logic synthesis operation may then be applied to the RTL specification to generate a list of logic gates and interconnections between the logic gates. The list may be referred to as a netlist, and may be used to implement the RTL specification.

A modern netlist may comprise millions of logic gates and associated interconnections. Conventional design tools may parse the netlist and determine placement of the logic gates and routing of the interconnections on an integrated circuit based thereon. The placement and routing information may be used to generate photolithography masks, which in turn may be used to fabricate the integrated circuit. The photolithography masks may consist of gate masks used to fabricate the logic gates of the netlist and routing masks used to fabricate the interconnections therebetween.

It may be desirable to change an original netlist so that it is functionally equivalent to a new specification. For example, a designer may wish to change a functional aspect of an original netlist due to an Engineering Change Order and/or due to an error in the original netlist. The designer may therefore create a new RTL specification and synthesize the new netlist therefrom. Alternatively, the designer may directly edit the original netlist to create a new netlist. The latter alternative may be employed late in the design process, because doing so will reserve most of the engineering effort invested in the original netlist.

The specific changes required to the new netlist are dependent upon the logical difference between the original netlist and the new netlist. Since a logical difference between two logic functions may typically be expressed in many different forms, the details of the change may differ based on the form in which the logical difference is expressed.

FIG. 1 is a logical diagram of original netlist $G_1$ and "target" netlist $G_2$. The present example will illustrate changes to netlist $G_1$ that result in functional equivalence with target netlist $G_2$. Either of "single-fix" signals $S_1$ and $S_2$ may be changed to accomplish this goal. FIG. 2A illustrates netlist $G_1$ after changing signal $S_1$. Specifically, signal $S_1$ has changed from $(c\hat{\ }d)'$ to $(c\hat{\ }d)'+e'$. The function $(c\hat{\ }d)'+e'$ may be called a rectification function because it rectifies a functional difference between original netlist $G_1$ and target netlist $G_2$. FIG. 2B illustrates a change of signal $S_2$ from $(ab)'$ to rectification function $(ab)'e$. Both systems shown in FIG. 2A and FIG. 2B are functionally equivalent to netlist $G_2$ of FIG. 1.

Systems have been proposed and for locating single-fix signals and deriving corresponding rectification functions. Such systems are typically not scalable, limited to simple correcting-models (e.g. gate type change, connection change, etc), and/or otherwise inefficient. Accordingly, further systems are desired for efficiently determining a change to an original netlist that will result in functional equivalence between the changed netlist and a target netlist exhibiting desired functionality.

Typically, a changed netlist will include some gates that were not present in the original netlist, will lack some gates that were present in the original netlist, and will reflect some different interconnections between the included gates. Accordingly, in order to fabricate an integrated circuit based on the changed netlist, new gate masks must be generated at a significant cost. Systems are therefore desired to implement a changed netlist using gate masks of an original netlist.

BRIEF DESCRIPTION OF THE DRAWINGS

FIG. 8 comprises pseudo code of an iterative process to determine a rectification function according to some embodiments.

FIG. 9 is a block diagram of a system to re-map a netlist based on a logical patch and available logic gates according to some embodiments.

DETAILED DESCRIPTION

Figure 1:
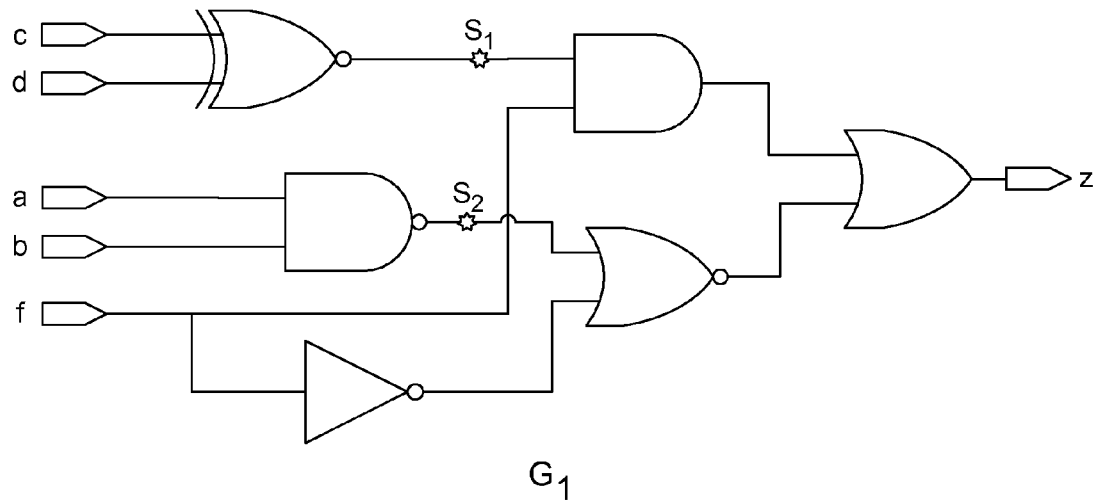
FIG. 1 comprises schematic diagrams of two netlists.
Figure 1:
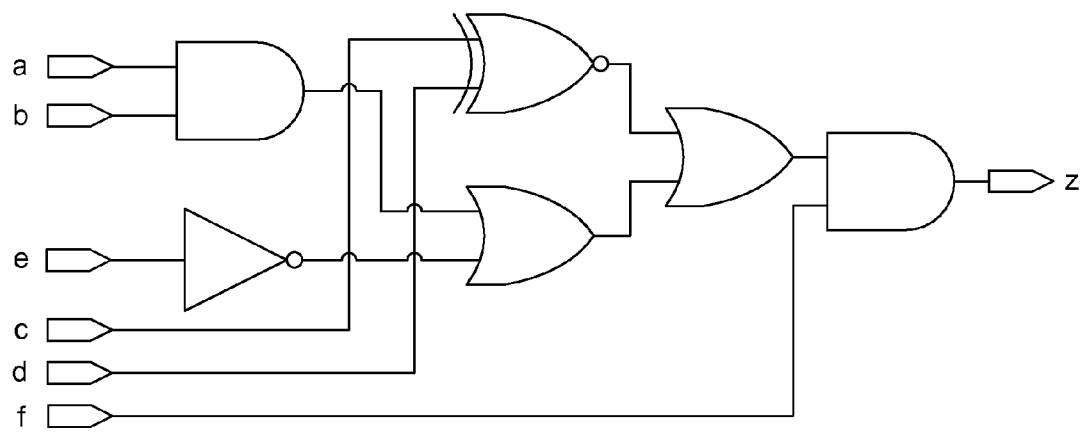
Figure 2A:
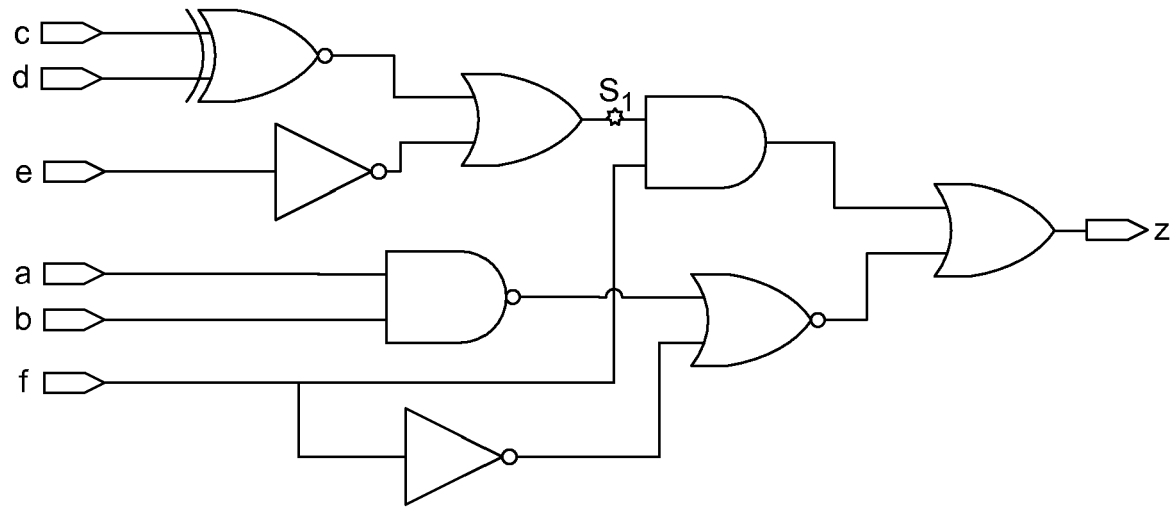
FIGS. 2A and 2B comprise schematic diagrams of a netlist that has been changed to achieve functional equivalence with another netlist.
Figure 2B:
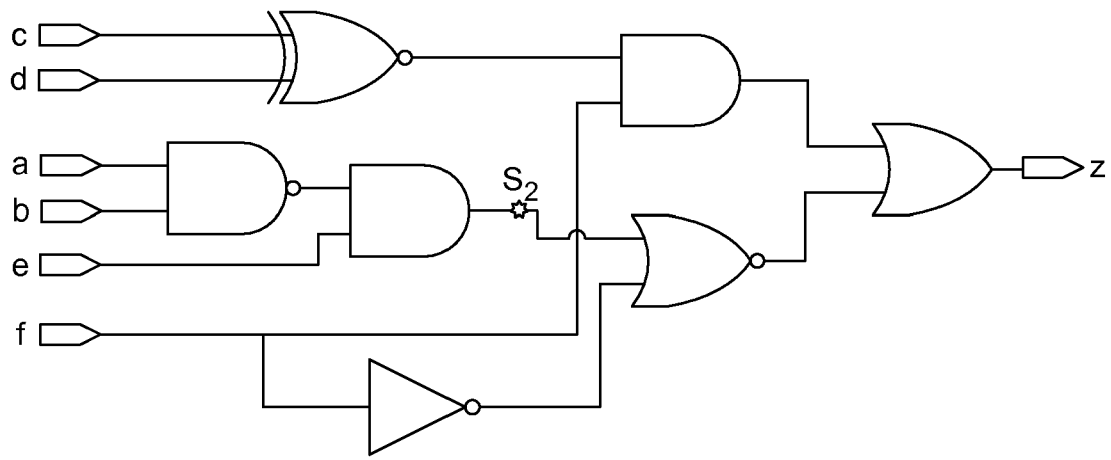
Figure 3A:
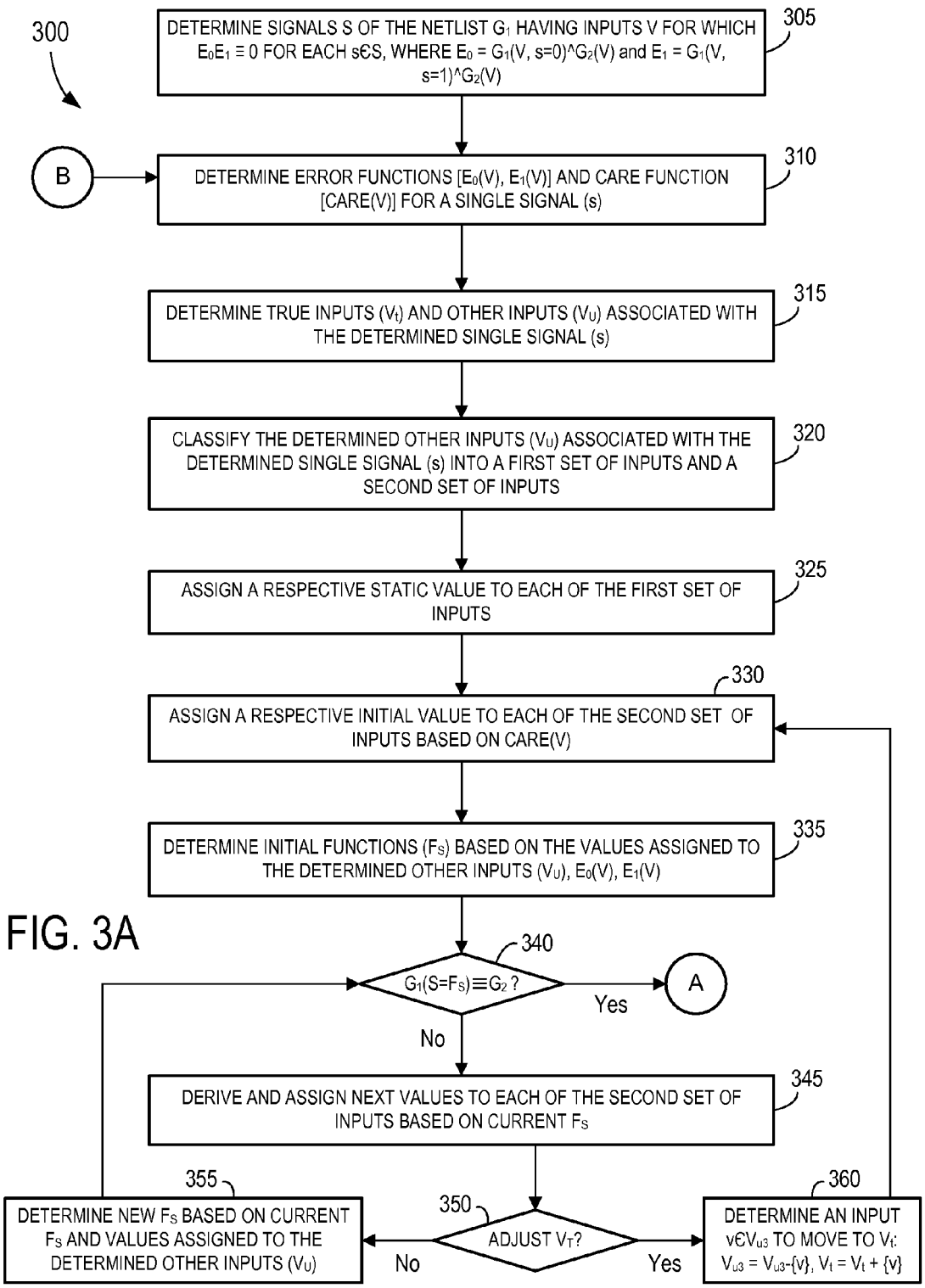
FIGS. 3A and 3B comprise a flow diagram according to some embodiments.
Figure 3B:
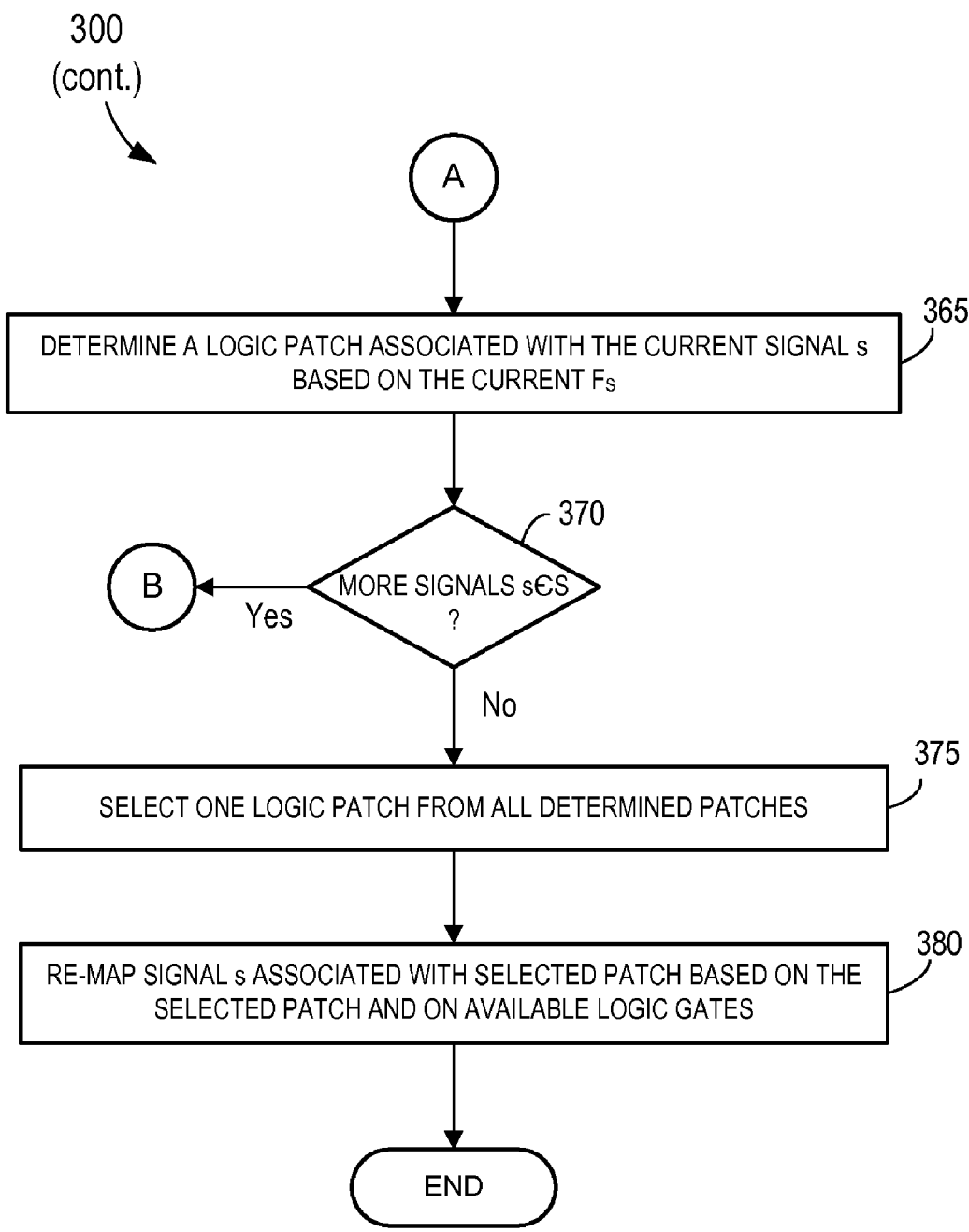

FIGS. 3A and 3B illustrate a flow diagram of process 300 to determine a function to rectify a logical difference between a first netlist and a second netlist. According to some embodiments, the first netlist may be changed to implement the function and, as a result, the changed netlist and the second netlist will be functionally equivalent. Process 300 may therefore be used in some embodiments to derive rectification functions implementing an engineering change order without re-excuting logic synthesis, placement or routing design processes. Such embodiments may also allow most gate masks of the first netlist to be used to fabricate an integrated circuit reflecting on the changed netlist. Some embodiments may provide a scalable solution that is applicable to disparate types of engineering change order requirements.

Process 300 and the other processes described herein may be executed by any combination of hardware, software and/or manual implementations. For example, the processes may be executed by a microprocessor executing processor-executable program code of a software application.

Figure 4:
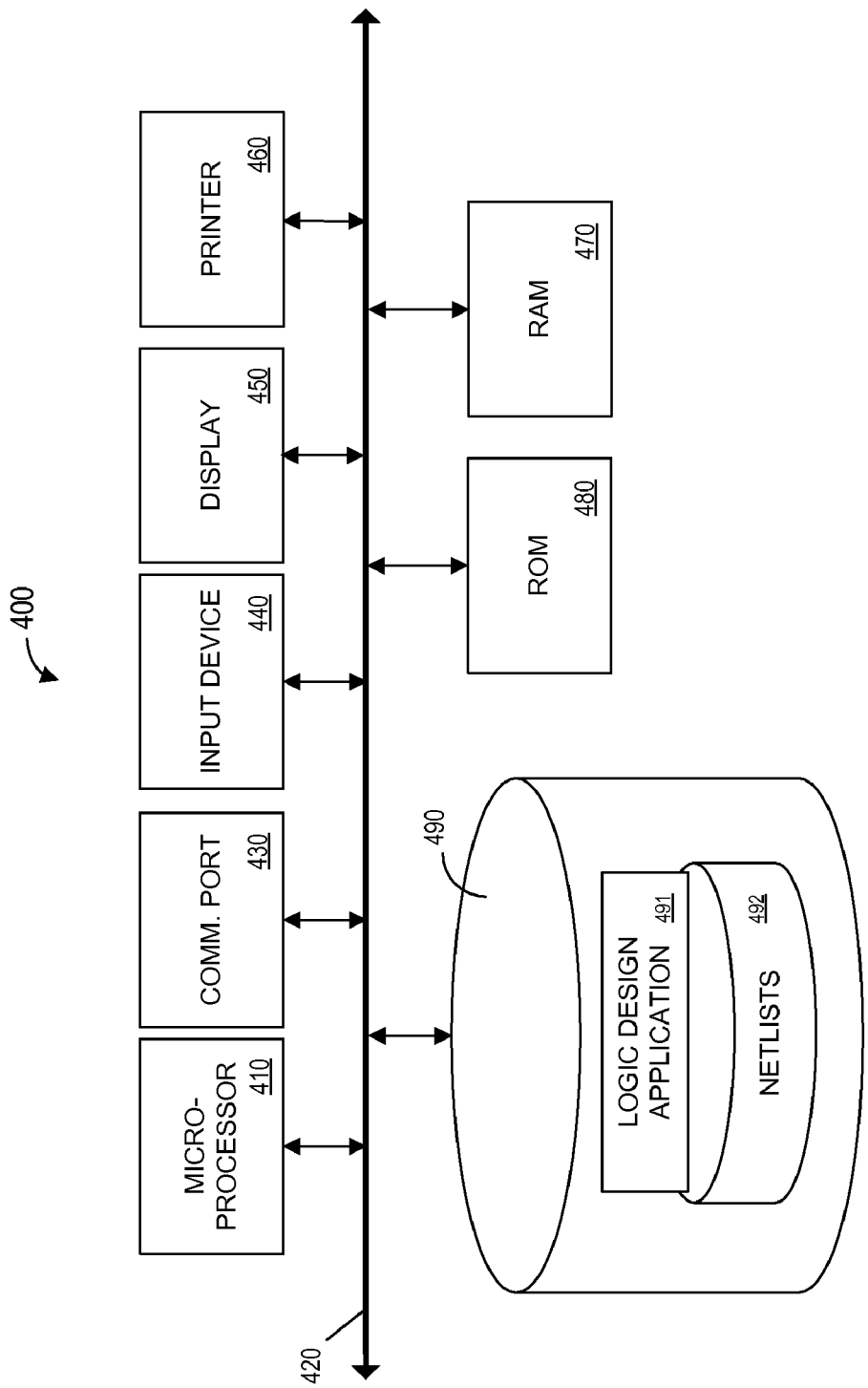
FIG. 4 is a block diagram of a computer system according to some embodiments.

FIG. 4 is a block diagram of an internal architecture of computer system 400 according to some embodiments of the invention. Computer system 400 may execute processes such as process 300 to be described herein. Computer system 400 may also or alternatively store data used in performance of these processes. According to some embodiments, computer system 400 comprises a desktop computer system.

Computer system 400 includes microprocessor 410 in communication with communication bus 420. Microprocessor 410 may comprise a RISC-based or other type of processor. Microprocessor 410 executes program code to control the elements of computer system 400 to provide desired functionality.

Communication port 430 is also in communication with communication bus 420. Communication port 430 may be used to transmit data to and to receive data from devices external to computer system 400. Communication port 430 is therefore preferably configured with hardware suitable to physically interface with desired external devices and/or network connections. For example, communication port 430 may comprise an Ethernet connection to a local area network through which computer system 400 may receive netlists from a logic design platform.

Input device 440, display 450 and printer 460 are also in communication with communication bus 420. Any known input device may comprise input device 440, including a keyboard, mouse, touch pad, voice-recognition system, or any combination of these devices. As mentioned above, information may also be input to computer system 400 from other devices via communication port 430. Display 450 may be an integral or separate CRT display, flat-panel display or the like used to display graphics and text in response to commands issued by microprocessor 410. Printer 460 may also present text and graphics to an operator, but in hardcopy form using ink-jet, thermal, dot-matrix, laser, or other printing technologies.

RAM 470 is connected to communication bus 420 to provide microprocessor 410 with fast data storage and retrieval. In this regard, processor-executable code being executed by microprocessor 410 is typically stored temporarily in RAM 470 and executed therefrom by microprocessor 410. Any suitable random access memory may be used as RAM 470. ROM 480, in contrast, provides storage from which data can be retrieved but to which data cannot be stored. Accordingly, ROM 480 may be used to store invariant process steps and other data, such as basic input/output instructions and data used during boot-up of computer system 400 or to control communication port 430.

Data storage device 490 stores, among other data, processor-executable code of logic design application 491. Microprocessor 410 therefore executes the code of logic design application 491 in order to control computer system 400 to determine a rectification function according to some embodiments. In some embodiments, program code of logic design application 491 embodies process 300.

The program code of logic design application 491 may be read from a computer-readable medium, such as a floppy disk, a CD-ROM, a DVD-ROM, a Zip™ disk, or a magnetic tape, and then stored in data storage device 490 in a compressed, uncompiled and/or encrypted format. In alternative embodiments, hard-wired circuitry may be used in place of, or in combination with, processor-executable code for implementation of processes according to some embodiments. Thus, embodiments are not limited to any specific combination of hardware and software.

Logic design application 491 may operate in conjunction with one or more of netlists 492 according to some embodiments. Netlists 492 may comprise lists of logic gates and interconnections, and/or may also include additional details. Netlists 492 may comprise one or more netlists generated according to some embodiments described herein.

Also stored in data storage device 490 may also be other unshown elements that may be necessary for operation of computer system 400, such as an operating system, a database management system, and "device drivers" for allowing microprocessor 410 to interface with other elements of computer system 400. Data storage device 490 may also include other applications and other data files to provide functionality such as Web browsing, calendaring, e-mail access, word processing, accounting, presentation development and the like. These elements are known in the art, and are therefore not described in detail herein.

Returning to process 300, a set S of one or more signals of netlist $G_1$ is determined at 305. Netlist $G_1$ may represent an original list of logic gates that was synthesized based on an RTL specification. The set S may be determined based on netlist $G_2$, which in turn represents logic gates for performing a desired function that differs from the RTL specification of netlist $G_1$. Netlist $G_2$ may be generated from a new RTL specification.

Figure 5:
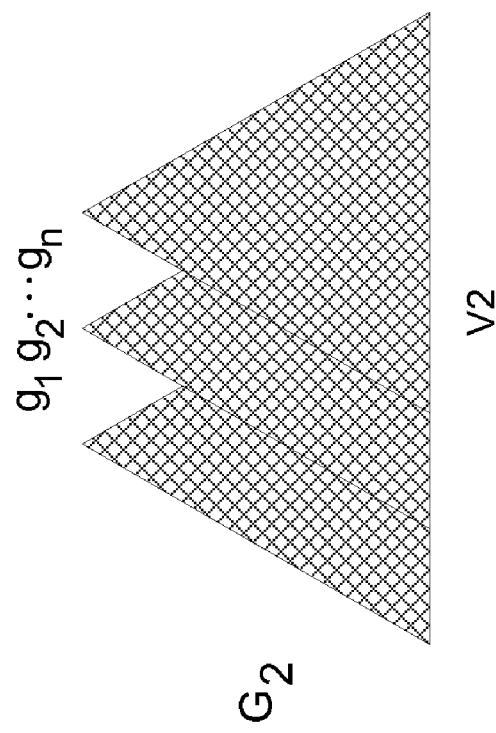
FIG. 5 comprises representation of overlapping logical cones for each of two netlists.
Figure 5:
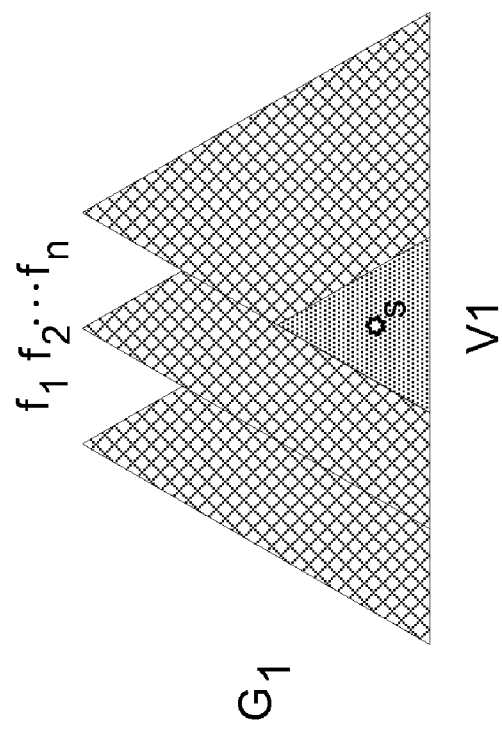

FIG. 5 represents netlist $G_1$ and netlist $G_2$ according to some embodiments. Netlist $G_1$ is comprised of logical cones $f_1, f_2 \ldots f_n$ having inputs V1 and netlist $G_2$ is comprised of logical cones $g_1, g_2 \ldots g_n$ having inputs V2. The illustrated signal s belongs to each of logical cones $f_1, f_2 \ldots f_n$ of netlist $G_1$. Inputs V1 and V2 may be different, but typically are substantially identical. Accordingly, inputs V1 and V2 will be described below as a single set of inputs V={V1, V2}. For example, if V1={a, b, c} and V2={b, c, d}, then V={a, b, c, d}.

Each of the signals s determined at 305 is a signal of netlist $G_1$ that can be re-synthesized so as to correct the functional differences between netlist $G_1$ and netlist $G_2$. Accordingly, each of the determined signals s may be referred to as a "single-fix" signal. The existence and determination of single-fix signals are known in the art.

Generally, a single-fix signal s is a signal of netlist $G_1$ that, for every input vector V of netlist $G_1$ and netlist $G_2$, can be assigned either a 0 or a 1 so as to cause the outputs of netlist $G_1$ and netlist $G_2$ to be identical. Symbolically, the single-fix signals s will be able to correct any functional differences between netlist $G_1$ and netlist $G_2$ if $E_0E_1 \equiv 0$, where $E_0 = G_1(V, s=0)\,\hat{}\,G_2(V) = \Sigma f_i(V, s=0)\,\hat{}\,g_i(V)$, $E_1 = G_1(V, s=1)\,\hat{}\,G_2(V) = \Sigma f_i(V, s=1)\,\hat{}\,g_i(V)$, and "$\Sigma$" is the logic "OR" operation. Accordingly, in some embodiments of 305, the equation $E_0E_1 \equiv 0$ is evaluated for each signal within the shaded triangular area of netlist $G_1$.

Next, at 310, error functions $E_0(V)$ and $E_1(V)$ and care function Care(V) are evaluated for a signal s which belongs to the determined single-fix signal set S. The error function $E_0(V)$ reflects the difference between the outputs of netlist $G_1$ and netlist $G_2$ for each input vector V in a case that s equals 0. Similarly, the error function $E_1(V)$ reflects the difference between the outputs of netlist $G_1$ and netlist $G_2$ for each input vector V in a case that s equals 1. According to some embodiments, and based on the relationships set forth above, $E_0(V) = G_1(s=0, V)\,\hat{}\,G_2(V)$ and $E_1(V) = G_1(s=1, V)\,\hat{}\,G_2(V)$.

The care function Care(V) indicates whether or not the output of netlist $G_1$ depends on the value of the signal s for each input vector V. For example, for a particular input vector V, Care(V)=1 if the output of netlist $G_1$ is a first value (i.e., 0 or 1) for s=0 and the output of netlist $G_1$ is a different value (i.e., 1 or 0) for s=1. If the output of netlist $G_1$ is a same value (i.e., 0 or 1) for s=0 and for s=1, Care(V)=0. One symbolic representation of the care function according to some embodiments is Care(V)=$\delta G_1/\delta s = G_1(s=0)\,\hat{}\,G_1(s=1) = \Sigma f_i(V, s=0)\,\hat{}\,f_i(V, s=1)$.

True inputs $V_t$ and other inputs $V_u$ associated with the single-fix signal s are determined at 315 from inputs V. Generally, the other inputs $V_u$ comprise a set of inputs which exist in Care(V) and in $E_0(V)$ or $E_1(V)$, and which theoretically can be optimized out of the rectification function by taking Care (V) into account during such optimization. Conventional symbolic methods may not exist to efficiently execute such an optimization due to the complexity of expressing $E_0$, $E_1$ and Care symbolically. As will be seen below, some embodiments include a novel mechanism of optimization employing an input classification, constant assignment, and an iterative process to derive the rectification function. Some embodiments provide a mechanism which is scalable to the size of design, and in which the quality of the derived rectification function is optimal or near optimal.

In some embodiments, an input v is classified into other inputs $V_u$ at 315 if the following equation is True:

$$E_0(v=0)E_1(v=1)+E_1(v=0)E_0(v=1)\equiv 0$$

Figure 6:
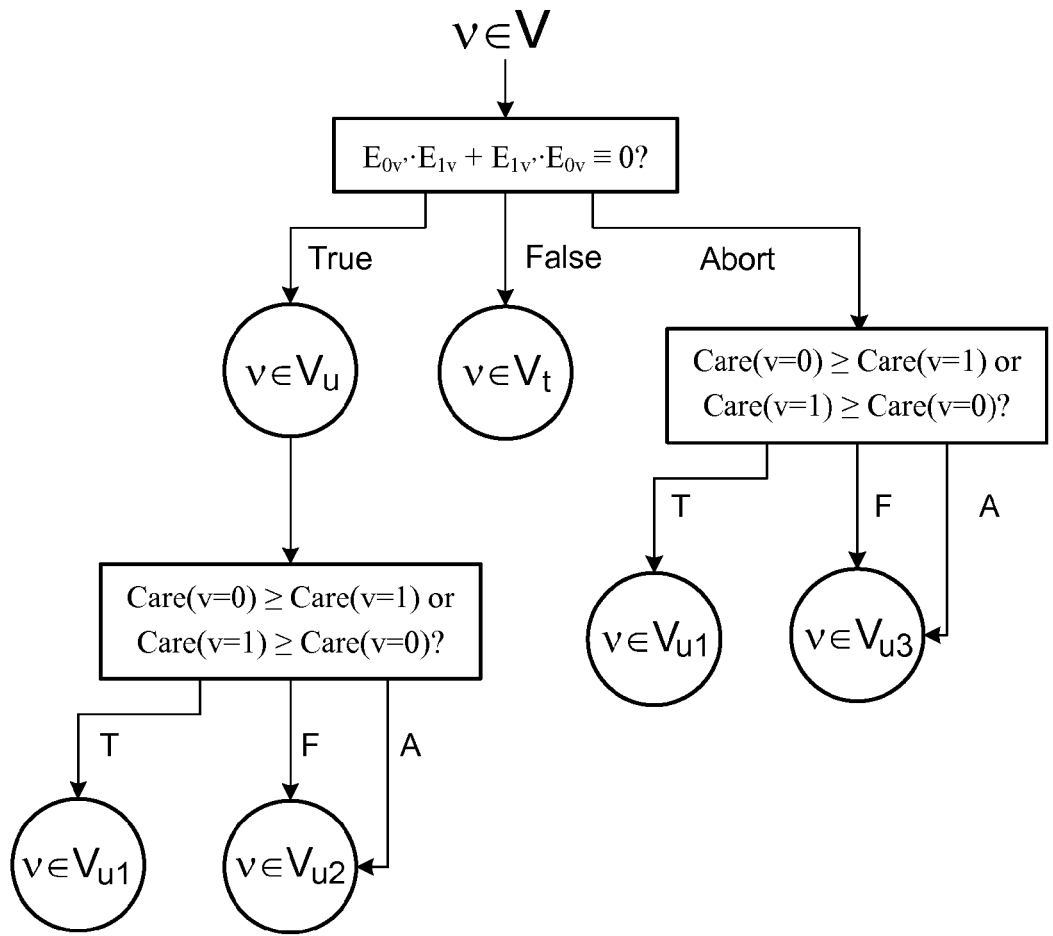
FIG. 6 is diagram illustrating classification of inputs according to some embodiments.

FIG. 6 is a diagram describing the determination of true inputs $V_t$ and other inputs $V_u$ according to some embodiments. All inputs $V=\{v_0, v_1, v_2, \ldots v_n\}$ are subject to the determination, which begins by evaluating the above equation. As shown, the inputs v for which the equation is True are assigned to other inputs $V_u$, and the inputs v for which the equation is False are assigned to true inputs $V_t$.

Next, the other inputs $V_u$ are further classified into a first set of inputs and a second set of inputs at 320. The first set of inputs includes those inputs $V_u$ that may be assigned a static value during the below-described iterative determination of the rectification function. The second set of inputs includes those inputs $V_u$ which will be associated with dynamically-assigned values during the iterative determination.

Continuing with the example of FIG. 6, the following equations are evaluated at 320 with respect to each of the other inputs $V_u$, $v \in V_u$:

$$\text{Care}(v=0) \geqq \text{Care}(v=1)$$

$$\text{Care}(v=1) \geqq \text{Care}(v=0)$$

The input $v \in V_u$ for which either of these equations is True is classified into the first set of inputs, denoted in FIG. 6 as $V_{u1}$. The second set of inputs (i.e., $V_{u2}$) comprises the inputs in $V_u$ for which both of these equations are False. Every input of $V_u$ is subject to the determination by evaluating the above equations and is classified into either first ($V_{u1}$) or the second ($V_{u2}$) set of inputs.

The determination at 315 and the classification at 320 may be performed using symbolic methods to evaluate the equations and therefore may provide inconclusive results due to computing limitations or other reasons. If the evaluation of an equation provides an inconclusive result, the evaluation may be considered "aborted". FIG. 6 also provides for classification of inputs in case that any of its equations are aborted (i.e., A. For example, some inputs v of $V_u$ may be classified as inputs $V_{u3}$ if the determination at 315 and the classification at 320 are aborted with respect to those inputs. The inputs of $V_{u3}$ will be treated the same as the inputs in $V_{u2}$ and be associated with dynamically-assigned values during the iterative determination of the rectification function. The only difference between $V_{u3}$ and $V_{u2}$ is that some inputs in $V_{u3}$ may be re-classified into true inputs $V_t$ later based on some determinations.

A respective static value is assigned to each of the first set of inputs (e.g., $V_{u1}$) at 325. In some embodiments of 325, a first input v of $V_{u1}$ is assigned a value of 0 if Care(v=0)$\geqq$Care(v=1) is True and a value of 1 if Care(v=1)$\geqq$Care(v=0) is True. The assignment is also performed with respect to each other v of $V_{u1}$. The determined set of values for $V_{u1}$ is denoted as $\alpha_{u1}$.

At 330, a respective initial value is assigned to each of the second set of inputs $V_{u2}$ and the inputs $V_{u3}$ based on Care(V). Since values were statically assigned to $V_{u1}$ at 325, inputs $V_{u2}$ and $V_{u3}$ remain unassigned prior to 330. The initial values assigned to inputs $V_{u2}$ and $V_{u3}$ cause the netlist $G_1$ to output one value (e.g., 0 or 1) if s=0 and to output a different value (e.g., 1 or 0) if s=1. Stated symbolically, a set of values is assigned to inputs $V_t$, $V_{u2}$ and $V_{u3}$ (together with the static value assignment to inputs $V_{u1}$ at 325) to result in Care(V)=$G_1$(s=0)$^\wedge G_1$(s=1)=1. The values thusly assigned to inputs $V_{u2}$ and $V_{u3}$ will be the desired respective initial value of inputs $V_{u2}$ and $V_{u3}$. The values assigned to inputs $V_t$ during the determination of the initial values for inputs $V_{u2}$ and $V_{u3}$ are simply discarded and therefore inputs $V_t$ will be treated symbolically during determination of initial function $F_s$.

330-365 describe an iterative process to compute the function $F_s$ which is to be substituted for the single-fix signal s so as to correct the functional difference between netlist $G_1$ and netlist $G_2$. Theoretically, $F_s$ can be computed based on either $E_0(V)$ or $E_1(V)$. Because of the difficulty in precisely predicting whether an $E_0(V)$-based or an $E_1(V)$-based computation is more desirable, in terms of the solution convergence in the iteration process or the quality of $F_s$, $F_s$ may be computed in parallel. One of the parallel computations may be based on $E_0(V)$, with the resulting $F_s$ being denoted as $F_s\_\text{on}$. The other computation may be based on $E_1(V)$ and the resulting $F_s$ may be is denoted as $F_s\_\text{off}$. $F_s\_\text{on}$ and $F_s\_\text{off}$ are updated in each iteration until it is determined at 340 to terminate the iterations.

At 335, two initial functions are first computed for $F_s\_\text{on}$ and $F_s\_\text{off}$ respectively based on the static and initial values assigned to the inputs $V_u$ (denoted as $\alpha u\_0$):

$$F_s\_\text{on}=E_0(V)|_{V_u=\alpha u\_0}$$

$$F_s\_\text{off}=E_1'(V)|_{V_u=\alpha u\_0}$$

Since all non-$V_t$ inputs have been assigned a static or initial value, the only variables of functions $F_s\_\text{on}$ and $F_s\_\text{off}$ are inputs $V_t$.

Figure 7:
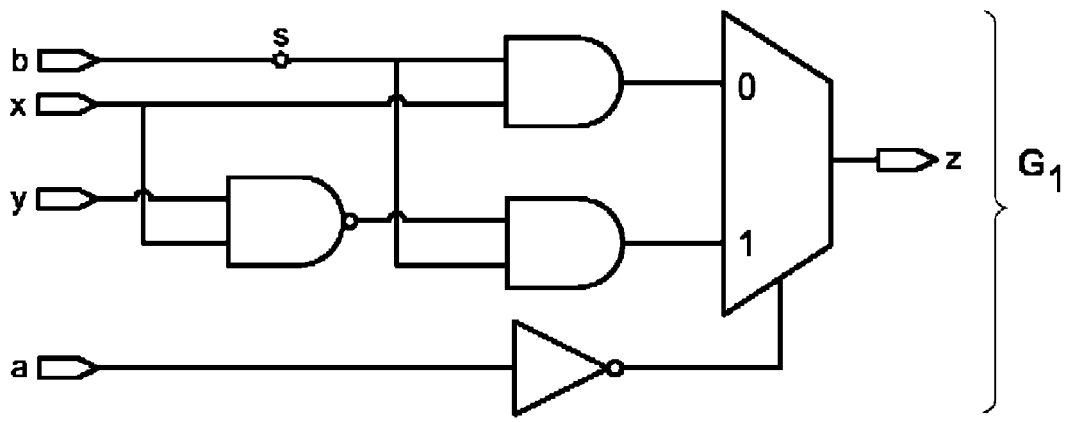
FIG. 7 illustrates iterative determination of a rectification function according to some embodiments.
Figure 7:
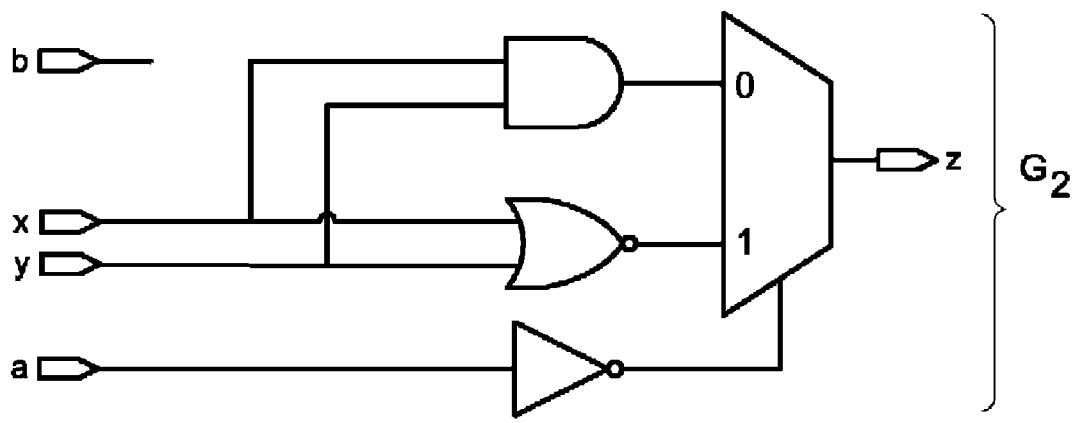

FIG. 7 includes logical diagrams of $G_1$ and $G_2$ for the purpose of describing one example of 335. Signal s of FIG. 7 has been identified as a single-fix signal of netlist $G_1$. For this particular example, because input b is shadowed by s in $G_1$ and also not used in $G_2$, it is ignored from the input list and V is comprised of inputs {a, x, y}. At 335, two initial rectification functions will be determined for $F_s\_\text{on}$ and $F_s\_\text{off}$ respectively. Turning to logic table 700, input a has been classified as an element of $V_{u2}$, and inputs x and y have been classified as elements of $V_t$. As shown, an initial value of 1 was determined for input a at 330 based on Care(V).

Netlists $G_1$ and $G_2$ are evaluated for each combination of inputs (x, y) while a=1. For each combination of inputs (x, y), values of $E_0$ and $E_1$ are determined and listed in the columns labeled "E0" and "E1". The initial functions of $F_s\_\text{on}$ and $F_s\_\text{off}$ are determined accordingly based on the first four rows of table 700:

$$F_s\_\text{on}=E_0|_{a=1}=xy$$

$$F_s\_\text{off}=E_1'|_{a=1}=x'+y$$

At 340, it is determined whether either of the initial functions $F_s\_\text{on}$ or $F_s\_\text{off}$ actually corrects the functional difference between $G_1$ and $G_2$. Symbolically, 340 comprises the evaluation of the following expressions:

$$G_1(V_{u1}=\alpha_{u1}, V, s=F_s\_\text{on})\equiv G_2(V_{u1}=\alpha_{u1})$$

$$G_1(V_{u1}=\alpha_{u1}, s=F_s\_\text{off})\equiv G_2(V_{u1}=\alpha_{u1})$$

The evaluation may result in one of three scenarios: (1) one of the expressions is true, in which case the corresponding initial function (i.e., $F_s\_\text{on}$ or $F_s\_\text{off}$) is the desired $F_s$ and flow proceeds directly to 365; (2) both of the expressions are true, in which case the smaller one of Fs_on and Fs_off is selected to be the desired $F_s$ and flow goes to 365 directly; or (3) neither of these expressions are true, in which case flow proceeds to 345.

Two input vectors α_on and α_off are generated at 345. The vectors may be generated during the evaluation of the above two expressions at 340. The vectors may be expressed symbolically as:

$$\alpha\_on = (\alpha_t\_on, \alpha_u\_on)$$

$$\alpha\_off = (\alpha_t\_off, \alpha_u\_off),$$

for which $$G_1(V=\alpha\_on, s=F_s\_on) \neq G_2(V=\alpha\_on)$$

$$G_1(V=\alpha\_off, s=F_s\_off)) \neq G_2(V=\alpha\_off)$$

Here, $\alpha_t\_on$ and $\alpha_t\_off$ are values for inputs of $V_t$, $\alpha_u\_on$ and $\alpha_u\_off$ are values for the other inputs $V_u$ including the statically-assigned values ($\alpha_{u1}$) to $V_{u1}$ which were determined at 325.

Next, at 350, it is determined whether to adjust the set of true inputs $V_t$. In this regard, inconclusive evaluations at 315 and 320 of the above-mentioned classification-related equations may have caused some "true" inputs to be erroneously classified into $V_{u3}$. Such misclassification may prevent $F_s\_on$ and/or $F_s\_off$ from achieving the goal of correcting the functional difference between $G_1$ and $G_2$ no matter how many iterations are performed. This scenario may be considered at 350 by evaluation of the following expressions:

$$F_s\_on(V_t=\alpha_t\_on)=1$$

$$F_s\_off(V_t=\alpha_t\_off)=0$$

If either of the above expressions are evaluated to be true, flow goes to 360 to re-classify at least one of the inputs in $V_{u3}$ into $V_t$.

In some embodiments of 360, the currently-assigned value of each input $V_{u3}$ is toggled independently and it is determined whether $F_s\_on$ or $F_s\_off$ still corrects the difference for the particular input vector (i.e., α_on or α_off). If the difference remains corrected, the toggled input is re-classified as an input $V_t$. Reclassification may comprise selection of a random (e.g., the first) input in $V_{u3}$ as an input $V_t$ if the above-described attempt to identify and re-classify an input $V_{u3}$ is unsuccessful. After reclassifying an input from $V_{u3}$ to $V_t$, flow returns to 330 for another iteration to derive the rectification functions for the current single-fix signal s.

If, at 350, it is determined that no reclassification is required, flow will proceed to 355. At 355, a new $F_s\_on$ and $F_s\_off$ are computed as follows:

$$F_s\_on = F_s\_on + E_0|_{vu=\alpha u\_on}$$

$$F_s\_off = F_s\_off \cdot E_1'|_{vu=\alpha u\_off}$$

$F_s\_on$ and $F_s\_off$ on the right-hand side of the above equations represent the previously-determined $F_s$ functions, which are either the initial functions $F_s$ or functions $F_s$ obtained from a previous iteration. αu_on and αu_off represent the static values originally assigned to the first set of inputs $V_{u1}$ and the next values assigned to the second set of inputs $V_{u2}$.

With respect to the FIG. 7 example, it is determined at 340 that neither of the previously-determined $F_s\_on$ and $F_s\_off$ fixes the functional difference between netlist $G_1$ and netlist $G_2$. Therefore, at 345, input vector a is generated to demonstrate the functional difference (a=0, x=0, y=0). Next, it is determined to not adjust $V_t$ at 350, and, at 355, the new Fs_on and Fs_off are derived based on the previous $F_s\_on$ and $F_s\_off$. The derivation may be based on the new value (i.e., 0) assigned to the input a as follows:

$$F_s\_on = F_s\_on + E_0|_{a=0} = xy + (x+y)' = x \, XNOR \, y$$

$$F_s\_off = F_s\_off \cdot E_1'|_{a=0} = (x+y') \cdot (x'y)' = x \, XNOR \, y$$

After derivation of the new Fs_on and Fs_off, flow returns to 340 from 355 to determine whether any of the newly-derived functions (Fs_on and Fs_off) corrects the functional difference between $G_1$ and $G_2$. In the present example, both of the new derived functions ($F_s\_on$ and $F_s\_off$) are determined at 340 to fix the functional difference and therefore one of the derived functions is selected to be $F_s$. Accordingly, flow proceeds to 365.

If, at 330, the initial value derived and assigned to input a is 0 instead of 1 as described above, the initial function $F_s\_off$ determined at 335 will fix netlist $G_1$ of FIG. 7. Flow would therefore proceed from 340 to 365 directly without performing an iteration. The respective determinations of $F_s$ based on $E_0$ and $E_1$ may approach a desired $F_s$ at different rates, which are related to the sequence of values assigned to $V_{u2}$ and $V_{u3}$.

At 365, it is determined if any existing logic in netlist $G_1$ may be used to further reduce the size of the determined rectification function $F_s$. Some embodiments of 365 include exploring logic-equivalent signals in netlist $G_1$ and $F_s$. If such signals are identified, $F_s$ may be re-formatted to utilize the existing logic. Since $F_s$ is constructed iteratively by $E_0$ or $E_1$, which are actually derived from netlist $G_1$ and netlist $G_2$, quite a number of signals in netlist $G_1$ may include logic that can be used in $F_s$. A logic patch implementing the resulting $F_s$ is created 365.

FIG. 8 comprises pseudo code 800 according to some embodiments. Pseudo code 800 roughly corresponds to 315 through 365 of process 300. For example, line 810 of pseudo code 800 describes determining $V_t$ and $V_u$ at 315, classifying $V_u$ into $V_{u1}$, $V_{u2}$ and $V_{u3}$ at 320, and assigning static values (i.e., C1) to $V_{u1}$ at 325.

Loop 820 includes determination of initial function $F_s$ (i.e., $F_s\_on$ and $F_s\_off$) at 335, determination of whether $G_1(S=F_s) \equiv G_2$ at 340, assignment of next values (i.e., u1, u2) to $V_{u2}$ and $V_{u3}$ at 345, determination at 350 of whether reclassification is needed, and determination at 355 of a new $F_s$ based on the previous $F_s$ and on the next values (i.e., Fs_on=Fs_on+$E_0$(Vu=u1), Fs_off=Fs_off·$E_1'$(Vu=u2)). Loop 830 corresponds to 360 of process 300 to identify an input classified into $V_{u3}$ and to re-classify the input into $V_t$.

Returning to process 300, it is determined at 370 whether any other single-fix signal s of netlist $G_1$ remains to be analyzed per 310 through 365. If so, flow returns to 310 and proceeds as described above with respect to a next single-fix signal s. One or more logic patches are therefore determined during successive iterations of 365, with each logic patch being associated with a respective single-fix signal s.

Flow continues from 370 to 375 if no other single-fix signal s of netlist $G_1$ remains to be analyzed. One logic patch is selected from the one or more determined logic patches at 365. According to some embodiments, the selected logic patch comprises the smallest (e.g., in number of gates) of the logic patches determined at 365. The selected logic patch may comprise one of the logic patches that would be most-easily incorporated into netlist $G_1$.

In this regard, signal s associated with the selected logic patch is re-mapped based on the selected patch at 380. The re-mapping may depend on available logic gates. For example, netlist $G_1$ may include unused logic gates that may be used to implement the logical patch. Alternatively or additionally, the logic patch may be implemented using gates that are no longer needed in the synthesis of signal s. 380 thereby generates a new netlist which is functionally equivalent to netlist $G_2$ and is identical to netlist $G_1$ but for the logic used to resynthesize signal s.

FIG. 9 illustrates system 900 according to some embodiments. System 900 may implement process 300 according to some embodiments. System 900 includes RTL specification RTL1 which is synthesized to produce netlist $G_1$. RTL specification RTL2 differs from RTL1 in order to change a functional aspect and/or correct an error of RTL1. Netlist $G_2$ is synthesized from RTL2.

Equivalence check 910 receives netlists $G_1$ and $G_2$ and determines logic patch 920 therefrom. Logic patch 920 resynthesizes one signal s of netlist $G_1$. The resynthesized signal s may comprise a single-fix signal netlist $G_1$ as described above. Accordingly, equivalence check 910 may embody 305 through 375 of process 300.

Re-map 930 may comprise a module to receive netlist $G_1$ and patch 920. Re-map 930 may re-map signal s within netlist $G_1$ according to patch 920. Re-map 930 may use freed and/or spare gates of netlist $G_1$ to implement patch 920. Such re-mapping creates new netlist $G_1(s^*)$, which is functionally equivalent to netlist $G_2$. Moreover, the gate masks of netlist $G_1(s^*)$ may be identical to the gate masks of netlist $G_1$, thereby sparing expensive re-masking steps. Routing between the gates of netlist $G_1(s^*)$ may of course differ from the routing of netlist $G_1$.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. A method to determine a function to rectify functional differences between netlist $G_1$ and netlist $G_2$ having inputs V, the method comprising:
   determining, via a microprocessor associated with a computer system, a signal s of netlist $G_1$ capable of being re-synthesized to correct the functional differences between netlist $G_1$ and netlist $G_2$;
   assigning, via the microprocessor associated with the computer system, respective static values to a first plurality of inputs V;
   assigning, via the microprocessor associated with the computer system, respective initial values to a second plurality of inputs V;
   determining, via the microprocessor associated with the computer system, a first function based on the assigned static values, the assigned initial values, a first error function reflecting the difference between outputs of netlist $G_1$ and netlist $G_2$ for each vector of inputs V in a case that s equals 0, and a second error function reflecting the difference between the outputs of netlist $G_1$ and netlist $G_2$ for each vector of inputs V in a case that s equals 1;
   determining, via the microprocessor associated with the computer system, whether the first function rectifies the functional differences between netlist $G_1$ and netlist $G_2$;
   if it is determined that the first function does not rectify the functional differences, assigning, via the microprocessor associated with the computer system, respective next values to the second plurality of inputs; and
   determining, via the microprocessor associated with the computer system, a second function based on the first function, the assigned static values, the assigned next values, the first error function, and the second error function.

2. The method according to claim 1, wherein determining the first function comprises:
   determining the first function based on the assigned static values, the assigned initial values, the first error function, the second error function, and a function indicating whether or not the output of netlist $G_1$ depends on the value of s for each vector of inputs V.

3. The method according to claim 2, wherein determining the second function comprises:
   determining the second function based on the first function, the assigned static values, the assigned next values, the first error function, the second error function, and the function indicating whether or not the output of netlist $G_1$ depends on the value of s for each vector of inputs V.

4. The method according to claim 1, wherein determining the signal s comprises:
   determining a signal that, for every vector of inputs V of netlist $G_1$ and netlist $G_2$, can be assigned either a 0 or a 1 so as to cause the outputs of netlist $G_1$ and netlist $G_2$ to be identical.

5. the method according to claim 1, wherein assigning respective static values to the first plurality of inputs comprises:
   assigning the value 0 to each of the first plurality of inputs which, if assigned a value of 0, results in the output of netlist $G_1$ depending on the value of s; and
   assigning the value 1 to each of the first plurality of inputs which, if assigned a value of 1, results in the output of netlist $G_1$ depending on the value of s.

6. The method according to claim 1, wherein assigning respective initial values to the second plurality of inputs further comprises:
   assigning respective initial values to the first set of inputs based on a function indicating whether or not the output of netlist $G_1$ depends on the value of s for each vector of inputs V.

7. The method according to claim 1, further comprising:
   determining a logical patch based on the second function.

8. The method according to claim 7, further comprising:
   re-mapping the signal s based on the logical patch and on available logic gates.

9. The method according to claim 1, wherein the first function is a function of a third plurality of inputs V, the method further comprising:
   prior to determining the second function, classifying one of the second plurality of inputs V as one of the third plurality of inputs V.

10. A tangible medium storing processor-executable code to determine a function to rectify functional differences between netlist $G_1$ and netlist $G_2$ having inputs V, the code comprising:
    code to determine a signal s of netlist $G_1$ capable of being re-synthesized to correct the functional differences between netlist $G_1$ and netlist $G_2$;
    code to assign respective static values to a first plurality of inputs V;
    code to assign respective initial values to a second plurality of inputs V;
    code to determine a first function based on the assigned static values, the assigned initial values, a first error function reflecting the difference between outputs of netlist $G_1$ and netlist $G_2$ for each vector of inputs V in a case that s equals 0, and a second error function reflecting the difference between the outputs of netlist $G_1$ and netlist $G_2$ for each vector of inputs V in a case that s equals 1;
  code to determine whether the first function rectifies the functional differences between netlist $G_1$ and netlist $G_2$;
  code to assign, if it is determined that the first function does not rectify the functional differences, respective next values to the second plurality of inputs; and
  code to determine a second function based on the first function, the assigned static values, the assigned next values, the first error function, and the second error function.

11. The medium according to claim 10, wherein the code to determine the first function comprises:
  code to determine the first function based on the assigned static values, the assigned initial values, the first error function, the second error function, and a function indicating whether or not the output of netlist $G_1$ depends on the value of s for each vector of inputs V.

12. The medium according to claim 11, wherein the code to determine the second function comprises:
  code to determine the second function based on the first function, the assigned static values, the assigned next values, the first error function, the second error function, and the function indicating whether or not the output of netlist $G_1$ depends on the value of s for each vector of inputs V.

13. The medium according to claim 10, wherein the code to determine the signal s comprises:
  code to determine a signal that, for every vector of inputs V of netlist $G_1$ and netlist $G_2$, can be assigned either a 0 or a 1 so as to cause the outputs of netlist $G_1$ and netlist $G_2$ to be identical.

14. The medium according to claim 10, wherein the code to assign respective static values to the first plurality of inputs comprises:
  code to assign the value 0 to each of the first plurality of inputs which, if assigned a value of 0, results in the output of netlist $G_1$ depending on the value of s; and
  code to assign the value 1 to each of the first plurality of inputs which, if assigned a value of 1, results in the output of netlist $G_1$ depending on the value of s.

15. The medium according to claim 10, wherein the code to assign respective initial values to the second plurality of inputs further comprises:
  code to assign respective initial values to the first set of inputs based on a function indicating whether or not the output of netlist $G_1$ depends on the value of s for each vector of inputs v.

16. The medium according to claim 10, the code further comprising:
  code to determine a logical patch based on the second function.

17. The medium according to claim 16, the code further comprising:
  code to re-map the signal s based on the logical patch and on available logic gates.

18. The medium according to Claim 10, wherein the first function is a function of a third plurality of inputs V, the code further comprising:
  code to classify one of the second plurality of inputs V as one of the third plurality of inputs V prior to determination of the second function.

19. A computer system to determine a function to rectify functional differences between netlist $G_1$ and netlist $G_2$ having inputs V, the computer system comprising:
  at least one data storage device; and
  at least one microprocessor in communication with the at least one data storage device, the at least one microprocessor configured to:
    determine a signal s of netlist $G_1$ capable of being re-synthesized to correct the functional differences between netlist $G_1$ and netlist $G_2$;
    assign respective static values to a first plurality of inputs V;
    assign respective initial values to a second plurality of inputs V;
    determine a first function based on the assigned static values, the assigned initial values, a first error function reflecting the difference between outputs of netlist $G_1$ and netlist $G_2$ for each vector of inputs V in a case that s equals 0, and a second error function reflecting the difference between the outputs of netlist $G_1$ and netlist $G_2$ for each vector of inputs V in a case that s equals 1;
    determine whether the first function rectifies the functional differences between netlist $G_1$ and netlist $G_2$;
    if it is determined that the first function does not rectify the functional differences, assign respective next values to the second plurality of inputs; and
    determine a second function based on the first function, the assigned static values, the assigned next values, the first error function, and the second error function.

20. The computer system of claim 19 wherein the microprocessor is further configured to determine the first function based on the assigned static values, the assigned initial values, the first error function, the second error function, and a function indicating whether or not the output of netlist $G_1$ depends on the value of s for each vector of inputs V.

21. The computer system of claim 20 wherein the microprocessor is further configured to determine the second function based on the first function, the assigned static values, the assigned next values, the first error function, the second error function, and the function indicating whether or not the output of netlist $G_1$ depends on the value of s for each vector of inputs V.

22. The computer system of claim 19 wherein the microprocessor, to determine the signal s, is further configured to determine a signal that, for every vector of inputs V of netlist $G_1$ and netlist $G_2$, can be assigned either a 0 or a 1 so as to cause the outputs of netlist $G_1$ and netlist $G_2$ to be identical.

23. The computer system of claim 19 wherein the microprocessor, to assign respective static values to the first plurality of inputs, is further configured to assign the value 0 to each of the first plurality of inputs which, if assigned a value of 0, results in the output of netlist $G_1$ depending on the value of s, and assign the value 1 to each of the first plurality of inputs which, if assigned a value of 1, results in the output of netlist $G_1$ depending on the value of s.

24. The computer system of claim 19 wherein the microprocessor, to assign respective initial values to the second plurality of inputs, is further configured to assign respective initial values to the first set of inputs based on a function indicating whether or not the output of netlist $G_1$ depends on the value of s for each vector of inputs V.

25. The computer system of claim 19 wherein the microprocessor is further configured to determine a logical patch based on the second function.

26. The computer system of claim 25 wherein the microprocessor is further configured to re-map the signals based on the logical patch and on available logic gates.

27. The computer system of claim 19 wherein the first function is a function of a third plurality of inputs V and the microprocessor is further configured to, prior to determining the second function, classify one of the second plurality of inputs V as one of the third plurality of inputs V.

* * * * *